United States Patent [19]
Alexandres

[11] Patent Number: 5,314,764
[45] Date of Patent: May 24, 1994

[54] FLEXIBLE WELDING BOARD FOR BATTERY PACK

[75] Inventor: Richard B. Alexandres, Clear Lake, Iowa

[73] Assignee: Alexander Manufacturing Company, Mason City, Iowa

[21] Appl. No.: 959,406

[22] Filed: Oct. 13, 1992

Related U.S. Application Data

[63] Continuation of Ser. No. 618,454, Nov. 27, 1990, abandoned.

[51] Int. Cl.$^5$ .................. H01M 2/26; H01M 6/00; H01M 2/10
[52] U.S. Cl. ................... 429/121; 429/122; 429/186
[58] Field of Search ............ 429/186, 121, 122

[56] References Cited

U.S. PATENT DOCUMENTS

| | | | |
|---|---|---|---|
| 3,339,169 | 8/1967 | Freeland | 429/121 |
| 3,861,775 | 1/1975 | Makins | 339/17 L |
| 4,853,317 | 8/1989 | Hayes | 430/318 |
| 4,920,019 | 4/1990 | Stoklosa et al. | 429/122 |

FOREIGN PATENT DOCUMENTS 23559514 2/1978 France.
1582979 1/1981 United Kingdom.

OTHER PUBLICATIONS

Patent Abstracts of Japan, vol. 13, No. 378, Aug. 22, 1989 JP A 01 129 490 (page unavailable).
Database WPIL, Week 8512, Derwent Publications, Ltd., London, GB; AN 85 071212 & JP A 60 024 990 (page unavailable)(year unavailable).

*Primary Examiner*—Anthony McFarlane
*Assistant Examiner*—Nhat D. Phah
*Attorney, Agent, or Firm*—Hugh D. Jaeger

[57] ABSTRACT

A flexible welding board for a battery pack, which is a polyester film with a laminated nickel alloy material. The polyester film with a co-extruded polymer adhesive includes a laminated nickel alloy thereon. The nickel alloy is subsequently silk screened with a pattern, and etched providing a flexible welding board for the welding of components of a battery pack, including the battery cells, electrical components and the electromechanical components which are spot-welded thereto. The entire process can be done robotically providing a battery pack which has electromechanical integrity between the battery cells, components, flexible welding board and the battery pack housing.

10 Claims, 5 Drawing Sheets

FLEXIBLE WELDING BOARD FOR BATTERY PACK

This patent application is a continuation of U.S. Ser. No. 07/618,454, filed Nov. 27, 1990, entitled "Flexible Welding Board for Battery Pack", now abandoned; which is related to co-pending patent application Ser. No. 07/619,520, filed Nov. 29, 1990, entitled "Process for Spot Welding a Flexible Welding Board to a Battery Cell", to the same assignee as the present patent application now U.S. Pat. No. 5,229,566.

BACKGROUND TO THE INVENTION

1. Field of the Invention

The present invention pertains to a battery pac-k, and more particularly, a nickel cadmium battery pack, with a nickel alloy flexible welding board, which allows for the welding of battery cells, electrical components and electromechanical components, including the battery cells directly to the flexible welding board. The welding is preferably by spot-welding.

2. Description of the Prior Art

In the past, battery packs, particularly nickel cadmium battery packs, have been assembled by hand where the batteries are spot-welded to each other by flat straps, such as stainless steel or nickel Then, the contacts are placed into the battery pack housing, and the batteries are again connected by spot-welding the flat straps to the battery contacts Finally, the electrical or electromechanical components such as thermistors, resistors, capacitors and any other components are connected along the process to the straps or the contacts, such as by spot-welding or soldering. This type of process is labor intensive, and takes considerable time and motion by a group of individuals to assemble each battery pack.

Prior art flexible circuits were not practical, as the circuits could not be mass-produced, nor could the flexible circuits be easily spot-welded or soldered. Prior art flexible circuits were not able to include all of the components, including the battery cells, the electrical components and the electromechanical components such as the battery casing contacts. Prior art flex circuits did not lend themselves to mass production for use in NiCad battery packs.

Prior art flexible circuits were usually a copper material on a polymer. After etching of the copper material, the copper had to be protected, such as by plating with a tin lead or a tin nickel. This was an additional time consuming step which added expense and labor.

The present invention overcomes the disadvantages of the prior art by providing a unique and novel flexible welding board where all of the electrical components and electromechanical components can be spot-welded to the flexible welding board for subsequent insertion into a battery housing or battery casing, thereby forming a battery pack.

SUMMARY OF THE INVENTION

The general purpose of the present invention is a battery pack including a flexible welding board of a nickel alloy laminated onto a deformable shape retaining polyester film with a co-extruded polymer adhesive therebetween. The electrical components and the electromechanical components can be directly welded onto the nickel alloy of the flexible circuit board with subsequent placement inside a polymer casing of the battery pack, thereby forming a battery pack The flexible welding board lends itself to mass production, particularly silk screening techniques or laminar film techniques, and etching techniques for forming the electrical circuit pattern on the nickel alloy which is laminated to the polymer film.

According to one embodiment of the present invention, there is provided a flexible welding board for a battery pack including a polymer film or polymer base with apertures formed at the welding locations, suitable co-extruded adhesive, and a laminated nickel alloy. The nickel alloy can be silk screened, a laminated film or lithographed with resist with electrical circuit patterns, etched with suitable chemicals, and subsequently processed to provide a welding pattern of the nickel alloy on the polymer film for subsequent electrical and electromechanical assembly, including battery cells, and electrical and electromechanical components to produce a battery pack. The battery cells, electrical components, electromechanical components and the flexible welding board are positioned in a polymer casing, including the contacts which can be spot-welded to the flexible welding board to produce the battery pack. The nickel alloy material spot-welds like stainless steel, and is very desirable for spot-welding.

Significant aspects and features of the present invention provide a flexible welding board for a battery pack, such as a NiCad battery pack which can be spot-welded.

Another significant aspect and feature of the present invention is a flexible welding board which is adaptable to robotic manufacturing processes and robotic welding processes. The nickel alloy material particularly lends itself to spot-welding.

A further significant aspect and feature of the present invention is a flexible welding board which provides for the attachment of electrical components, including battery cells, resistors, capacitors and thermistors, as well as electromechanical components such as battery pack contacts for battery chargers where the battery pack contacts mount within the polymer casing of the battery housing and are spot-welded directly to the flexible welding board.

A further significant aspect and feature of the present invention is a flexible welding board having nickel alloy battery interconnection straps and at least two contacts adhesively secured to a polymer flexible base. The base is so dimensioned and the contacts and straps so oriented and dimensioned such that automatic alignment of the straps and contacts with the battery terminals is effected when the base is formed about a battery pack.

A still further significant aspect and feature of the present invention is that the flexible welding board can be fabricated as a continuous strip with discrete multiple circuit patterns formed thereon at spaced intervals. The strips can be coiled for continuous processing. The strips can be formed into a U-shape in a process line and will retain the formed shape. This feature is particularly desirable in facilitating the placement of battery cells within the formed welding board.

Having thus described the preferred embodiments of the present invention, it is a principal object hereof to provide a flexible welding board for a battery pack, such as for a portable radio or any other electrical or electronic device.

One object of the present invention is a nickel alloy flexible welding board for use in a battery pack.

Another object of the present invention is a nickel alloy flexible welding board which can be readily manufactured by automated etching processes.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
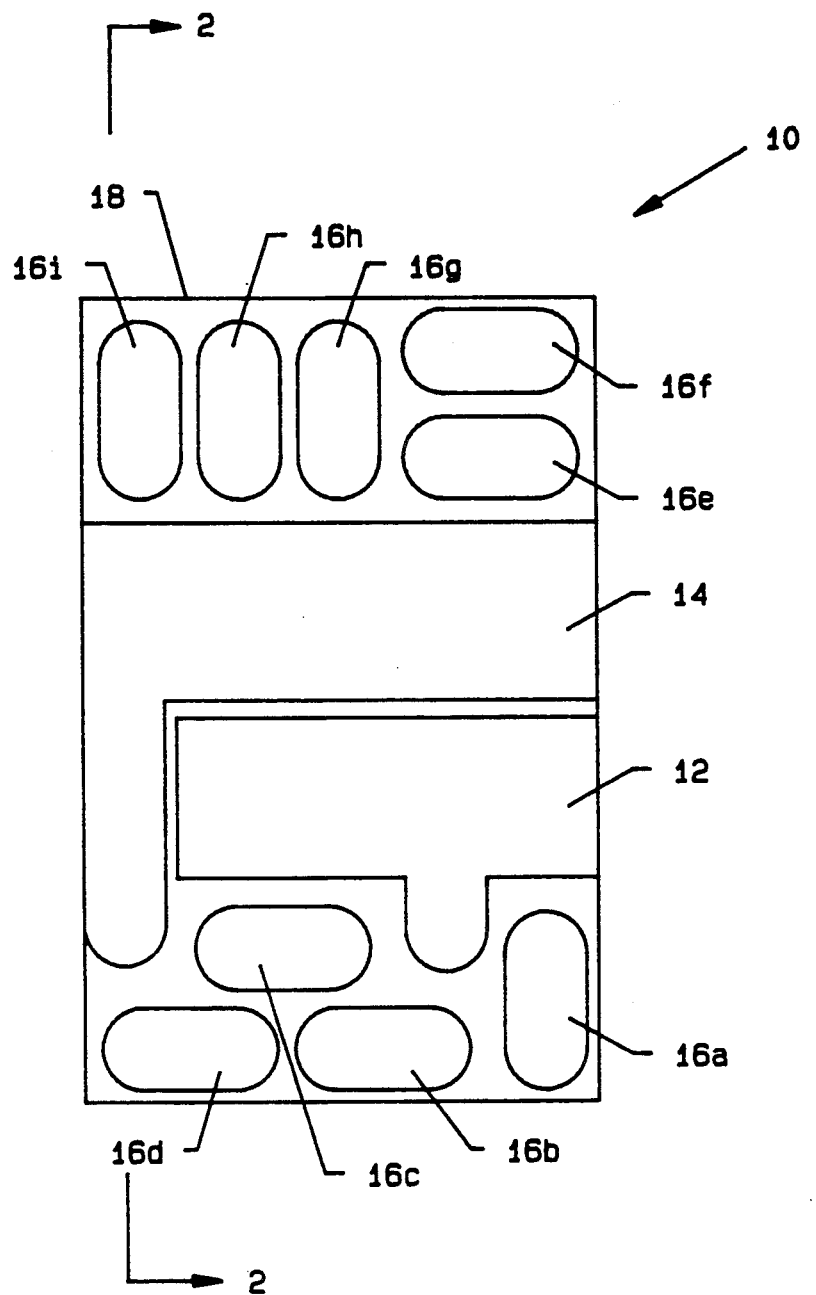
FIG. 1 illustrates a plan view of a flexible welding board, the present invention.

FIG. 1 illustrates a plan view of a flexible welding board 10, the present invention, including a plus pad 12, a minus pad 14, and battery straps 16a-16n, all of which are adhesively secured to a polyester base 18, as later described in detail The battery straps 16a-16n accommodate a plurality of cells, such as AA cells, by way of example and for purposes of illustration only, and not to be construed as limiting of the present invention. Any other size battery cell can be utilized. The battery cells can be alkaline, mercury, NiCad, or any other suitable type of cells. The battery straps 16a-16n wrap around the alternating cells, and in this instance, provide a 15 volt disposable alkaline battery for an electronic product, such as a portable radio such as a Handie-Talkie FM radio, also referred to as an "HT". An assembly of the cells and the flexible welding board then engages into a molded plastic housing. The large flat rectangular portions form the contact pad points through holes in the molded polymer housing as later described in detail. The principals and teachings of the present invention can pertain to any other types of battery cells, and any other types of electrical and electromechanical configurations. The battery straps 16a-16n are spot-welded onto the ends of each cell, and the spot-welding occurs through the polyester film 18 to engage and make contact with the appropriate end of the cell, as later described in detail Usually, it only takes two spot-welding electrodes to make contact, but in this instance, three or more spot-welding electrodes may be preferable for efficient electromechanical contact and for the appropriate surface area contact for current flow between the battery straps and the batteries. The metal material is a nickel alloy, such as Olin 715 Copper-Nickel Alloy. Olin 715 Copper-nickel ally, manufactured by Olin Brass, comprise nominally by weight 69.5% copper, 0-.05% lead, 0.4-1.0% iron, 0-1.0% zinc, 29-33% nickel, and 0-1.0% manganese. This alloy is laminated to a polyester film of a suitable thickness with a co-extruded adhesive. Any suitable alloy can be utilized, as well as any suitable base material such as a polymer base or any other type of base material.

Figure 2:
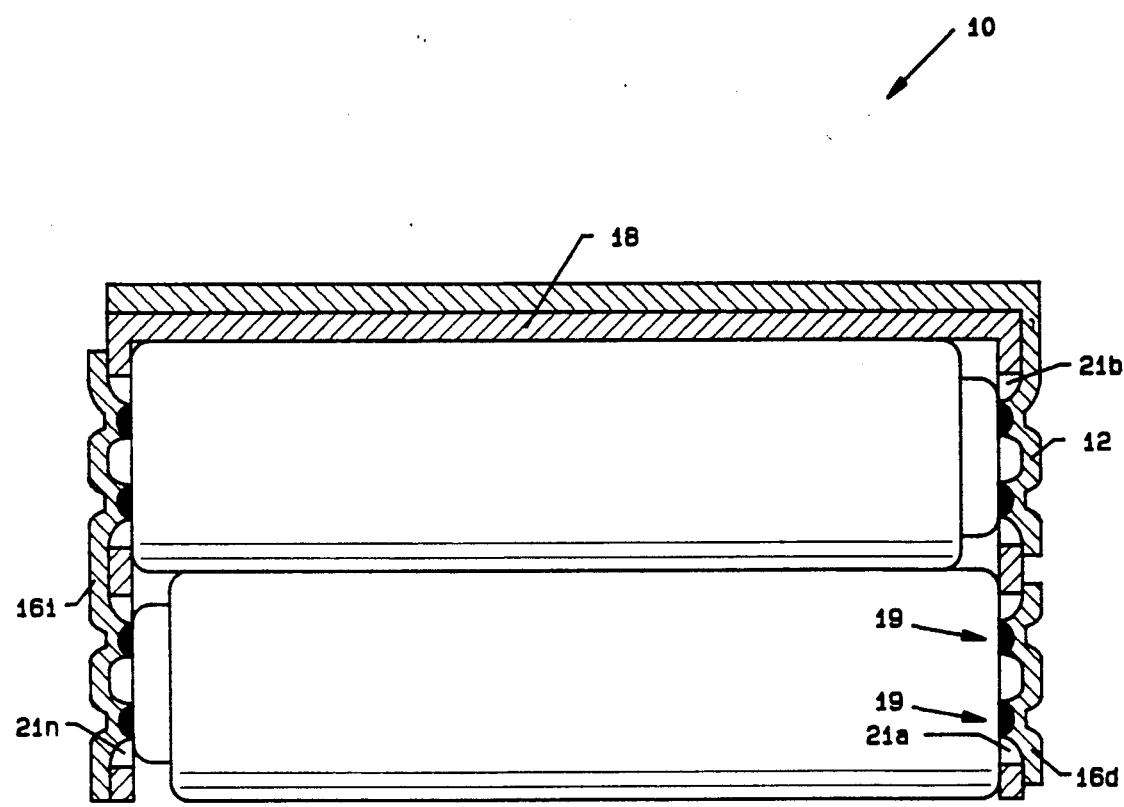
FIG. 2 illustrates an end view of the flexible welding board.

FIG. 2 illustrates an end view of the flexible welding board 10 including the polyester film 18, the co-extruded adhesive 20, and the battery straps 16a-16n. Two cells are appropriately positioned and spot welded to the straps of the flexible welding board 10. A typical weld 19 is made through the straps 16a-16n through the plurality of holes 21a-21n in the polyester film 18. The dimensions are exaggerated to appropriately illustrate the teachings of this patent.

Figure 3:
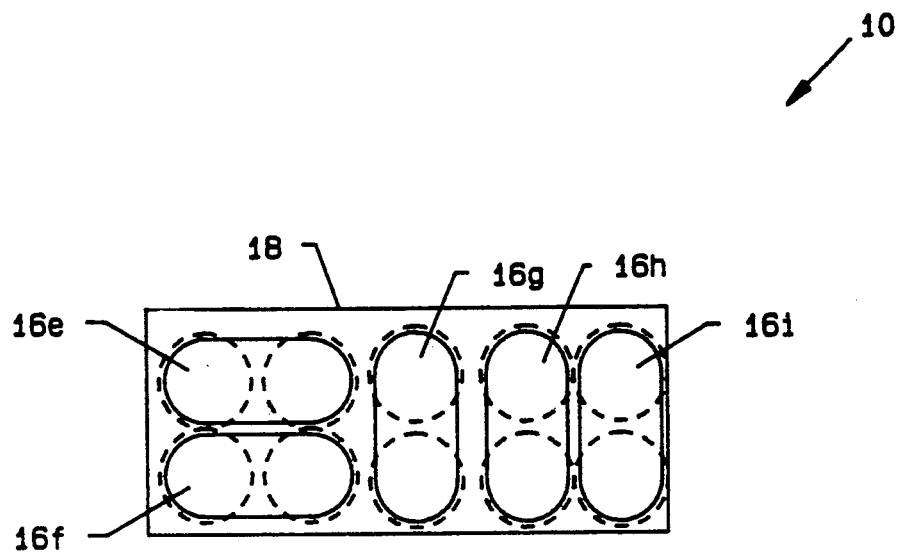
FIG. 3 illustrates a front view of the flexible welding board about battery cells taken along line 2-2 of FIG. 1, including two alternating size AA cells in place.

FIG. 3 illustrates a front view of the flexible welding board 10 engaged about battery cells of alternating size AA cells in place. All other numerals correspond to those elements previously described.

Figure 4:
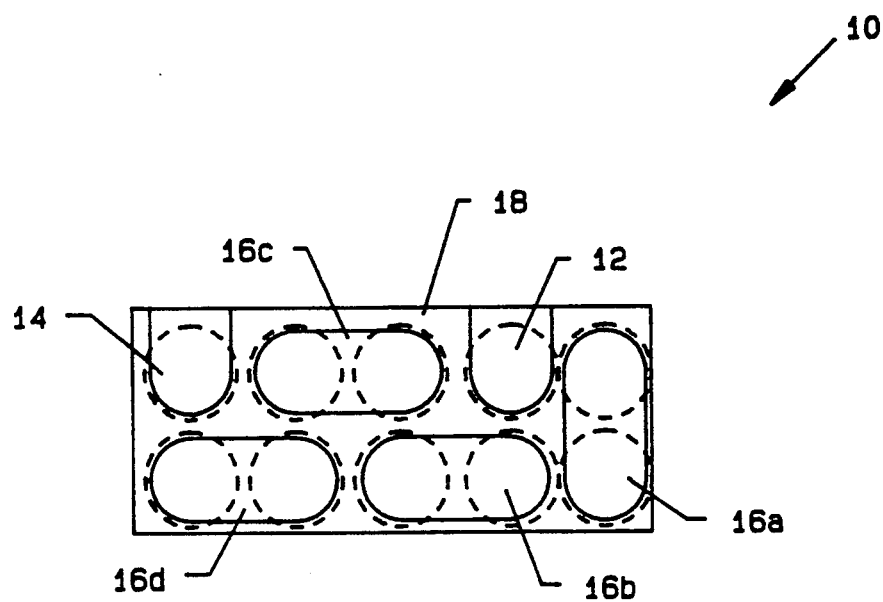
FIG. 4 illustrates a back view of a flexible welding board.

FIG. 4 illustrates a back view of the flexible welding board of FIG. 2. All numerals correspond to those elements previously described, including the alternating battery cells.

Figure 5:
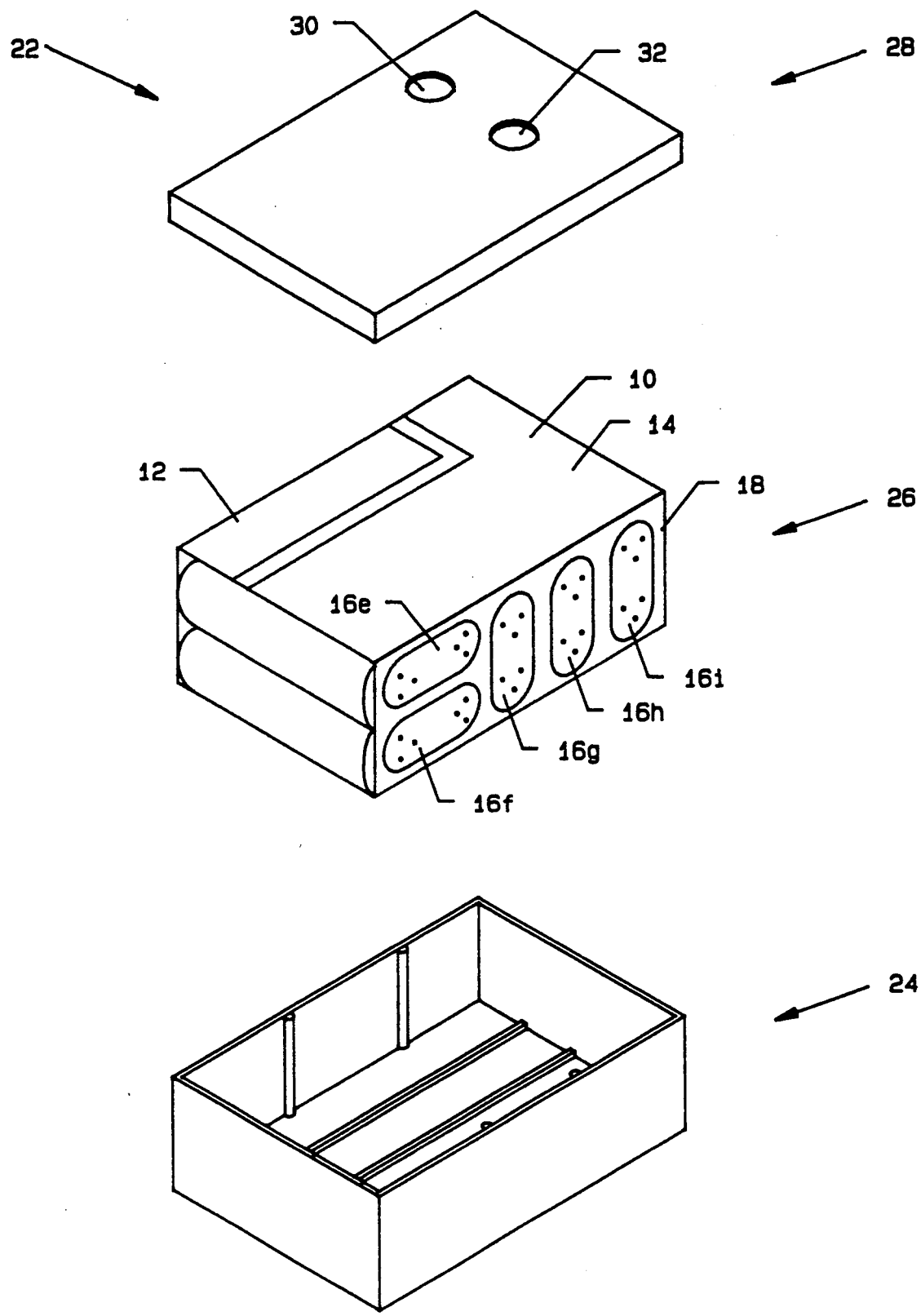
FIG. 5 illustrates an exploded view of a front view of the back half of a battery pack, the flexible welding board with battery cells, and a front view of the front half of the battery pack.

FIG. 5 illustrates an exploded view of a front view of a battery pack 22, including a back half 24, a flexible welding board 10 with the batteries forming a battery assembly 26, and a front view of the front half 28 of the battery pack 22. As shown at 26, the flat flexible welding board 10, as shown in FIG. 1, has been deformed into a U-shape with battery straps 16e-i overlying terminals on one end of the batteries and straps 16a-d overlying terminals on the other end of the batteries for electrical connection through holes 30 and 32. All numerals correspond to those elements previously described. The back half 24 of the battery pack 22 is essentially a small, rectangular box. The front half 28 of the battery pack 22 includes two holes 30 and 32 which provide for engagement of the contact plates of the flexible welding board 10 with the contact fingers of a Handie-Talkie radio when the battery pack 22 is inserted into the battery compartment of the Handie-Talkie radio. Other electrical or electromechanical components can be spot-welded to the flexible welding board 10, such as battery contacts, thermistors, thermal activated switches, diodes, or any other components.

MODE OF OPERATION

The flexible welding board 10 is manufactured by processes so that the welding alloy geometrical configuration remains on the polyester film 18 after the processing steps. Representative processing steps are now described below.

1. The circuit pattern is either laminated with dry lamin or film, and then processed in a conventional manner, or the circuit pattern is silk-screened onto the nickel alloy. Either step is an acceptable process for laying out the circuit pattern of resist material on the alloy.

2. The nickel alloy is then processed in a suitable processing station, and particularly lends itself to horizontal processing with a plurality of stations. What is advantageous is that the material can be done in a real-to-real processing fashion because of the steps of laying out the resist pattern onto the nickel alloy material, which can be repetitive or can change on a long length of material, and then the material can be coiled at the input end and the output end of a processor.

3. The process station would include an etch chamber, a cascade rinse chamber, a fresh water rinse chamber, an inspection station chamber, a spray stripping solution station for the resist material, a fresh water rinse station, and a blower drying station.

4. The etch chamber is a ferric chloride solution, such as Olin 838383, which is a combination of ferric chloride, hydrochloric acid and ammonium chloride. This particularly lends itself to etching of the nickel alloy and is advantageous because the ferric chloride etching solution is inexpensive, environmentally and economically preferred, and readily etches the nickel alloy. Any suitable caustic solution can be used to etch the resist over the welding board pattern which remains after the etching away of the nickel alloy which was not coated with resist After processing, the flexible welding board can be cut apart, such as on a paper cutter, or punched apart, such as on a punch press. The teachings of the present invention include a process to manufacture product of a flexible welding board, which can be for large sized battery packs, such as for HTs, to small sized battery packs, such as for Flip-Phones.

The product of the flexible welding board 10 of FIG. 1 is manufactured by the new and novel recognition that the nickel alloy can be adhesively secured to the polyester film 18, which can then include spot-welded electrical or electromechanical components, including but not limited to the components selected from the group of: battery cells, resistors, capacitors, thermal cutouts, thermistors, diodes, jumper wires, battery contacts and any other electrical or electromechanical components.

Various modifications can be made to the present invention without departing from the apparent scope hereof.

We claim:

1. A battery pack comprising:
   a. a U-shaped polymer substrate;
   b. at least two strips of conductive material laminated by adhesive means to said substrate;
   c. at least one battery cell having positive and negative terminals at opposite ends disposed within said U-shaped substrate; and,
   d. welds securing one of said strips to the negative terminal and the other of said strips to the positive terminal.

2. The battery pack of claim 1 wherein the strips are a nickel alloy.

3. A battery pack comprising:
   a. a U-shaped nonconducting substrate;
   b. a plurality of conductive strips adhesively secured to said nonconducting substrate;
   c. a plurality of battery cells each having positive and negative terminals at opposite ends disposed within said U-shaped substrate; and,
   d. welds securing said conductive strips to said terminals to electrically interconnect said cells.

4. The battery pack of claim 3 wherein the conductive strips are a nickel alloy.

5. The battery pack of claim 4 further comprising a polymer housing encompassing said interconnected batteries.

6. The battery pack of claim 5 wherein the polymer housing has at least two apertures overlying two of said conductive strips to facilitate electrical connection to external devices.

7. A flexible welding board consisting of:
   a. a U-shaped polyester film with a co-extruded adhesive; and,
   b. at least one metal strip of an alloy comprising by weight approximately 69.5% copper and approximately 30% nickel laminated by adhesive means to said polyester film.

8. A flexible welding board consisting of:
   a. a U-shaped polymer substrate; and,
   b. at least one strip of an alloy comprising by weight approximately 69.5% copper and approximately 30% nickel laminated by adhesive means to said substrate.

9. The battery pack of claim 1 wherein said conductive material is an alloy comprising by weight approximately 69.5% copper and approximately 30% nickel.

10. The battery pack of claim 3 wherein said conductive strips are an alloy comprising by weight approximately 69.5% copper and approximately 30% nickel.

* * * * *